United States Patent [19]
Freeman

[11] 3,973,255
[45] Aug. 3, 1976

[54] TOUCH RESPONSIVE KEYBOARD APPARATUS

[76] Inventor: Alfred B. Freeman, 20418 Seaboard Road, Malibu, Calif. 90265

[22] Filed: Dec. 24, 1974

[21] Appl. No.: 536,172

Related U.S. Application Data

[63] Continuation-in-part of Ser. No. 348,304, April 5, 1973.

[52] U.S. Cl. .................. 340/365 E; 340/365 C; 340/146.1 AG
[51] Int. Cl.² ........................................ G08C 1/00
[58] Field of Search .......... 340/365 E, 365 C, 365 S

[56] References Cited
UNITED STATES PATENTS

| | | | |
|---|---|---|---|
| 3,588,875 | 6/1971 | Gabor | 340/365 C |
| 3,627,935 | 12/1971 | Spievak | 340/365 S |
| 3,676,615 | 7/1972 | Wiedmer | 340/365 E |
| 3,778,817 | 12/1973 | Silverberg | 340/365 C |

*Primary Examiner*—Thomas B. Habecker

[57] ABSTRACT

A keyboard apparatus for utilizing equipments, such as electronic musical instruments, computers, and other control and data handling devices, which responds to imposition of a flexible conductive element, such as the operator's finger, on a selected one of a plurality of areas to produce a representation for a character or function corresponding to the selected area. This apparatus consists of a plurality of conductors exposed in different combinations in different areas and a set of logic circuits which discriminately gate the conductors to utilizing equipment when proper combinations are energized. Several conductor arrangements with combinations all sharing one or more unique characteristics are disclosed, along with different logic systems responsive to the characteristics to assure that erroneous information will not be read in. Also disclosed is apparatus to produce an audible sound each time a read in is made and thereby indicate to the operator when the keyboard has responded.

2 Claims, 13 Drawing Figures

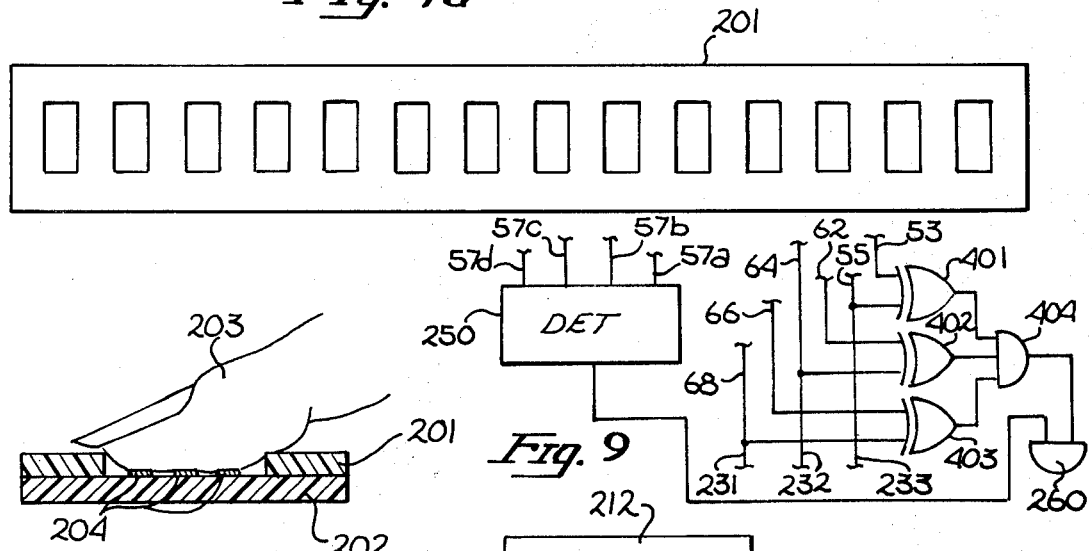
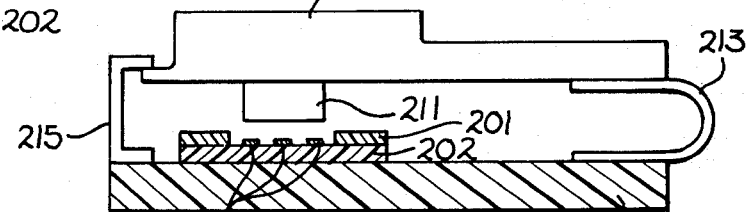
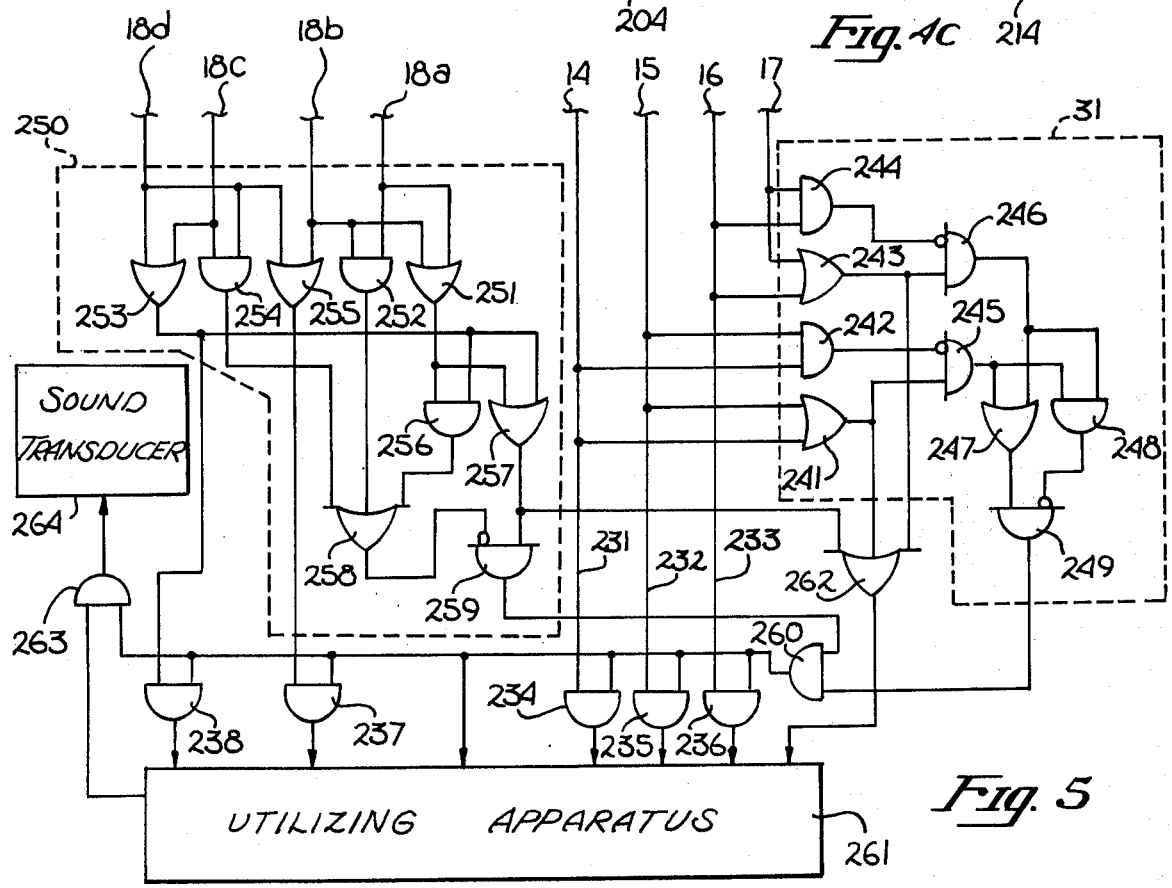

TOUCH RESPONSIVE KEYBOARD APPARATUS

This application is a continuation-in-part of application Ser. No. 348,304 filed Apr. 5, 1973 for a TOUCH RESPONSIVE KEYBOARD APPARATUS.

BACKGROUND OF THE INVENTION

1. Field of the Invention

The invention is in the field of keyboard apparatus for input of one character or function at a time and particularly of that type of apparatus which is responsive to imposition of a flexible conductive member, such as the operator's finger, to energize a selected combination of conductors to represent a selected character or function.

2. Discussion of the Prior Art

Modern integrated circuits can provide complex electronic devices which are low cost, small, and light weight. It can be expected that further developments will continue to increase complexity while reducing cost and size. In equipments requiring a keyboard, conventional keyboard apparatus may contribute substantially to the size and cost. In the case of pocket calculators and similar equipments, the cost and size limits are determined by the keyboard apparatus. The range of equipments which are practical will be expanded with reduction in size and cost of keyboard apparatus.

Mechanical switches having more than one pole are bulky and expensive, so conventional keyboards to provide codes representing characters or functions generally use single pole switches and encoding circuits. Each switch represents a character or function by energizing a lead going to the encoding circuit which then produces the desired binary or other code representation. The number of connections required between the keyboard and the encoding circuit is equal to the number of characters and functions.

The encoding circuitry could be included on the same integrated circuit chp as the utilizing apparatus with only a small addition to the cost of the chip for the added circuitry. A large number of pins would be required on the integrated circuit pack for connections between the keyboard and the encoding circuits on the chip. Each connection requires a considerable chip area and is presently made by hand labor so the cost for a large number of connections is considerable.

Present electronic equipments use circuits with a fast speed of response so they are susceptible to errors resulting from various types of keyboard transients. The prior art includes many systems designed to overcome the effects of key bounce and other keyboard transients and obtain proper entry of data.

Some electronic musical instruments play only one note at a time and can respond to only one operated playing key at a time. In U.S. Pat. No. 3,610,801, Fredkin and Minsky control the playing of such an instrument by providing a binary code to represent each note to be played. My U.S. Pat. No. 3,711,618 discloses apparatus which plays chords and bass along with a solo melody in response to an input from a keyboard for each melody note. The circuitry for such electronic musical instruments can now be built on integrated circuit chips so reduction of the cost and size of keyboards becomes more important for these instruments as it has for other electronic equipments.

SUMMARY OF THE INVENTION

The invention provides a keyboard of minimum cost and size by using a printed circuit board with different combinations of conductors exposed in different areas. A flexible conductive member, such as the operator's finger, pressed against a selected area, electrically couples its exposed conductors to a potential source and thereby energizes the combination of conductors which represent the associated character or function. As the representations for characters and functions are produced directly by energized combinations of conductors, encoding circuits are not needed, and the number of connections to the keyboard are greatly reduced. The logic circuits to discriminate against entry of erroneous information from the keyboard can be locted on the integrated circuit chip with circuitry of the utilizing apparatus without greatly increasing the number of pins required on the pack and so without a substantial increase in cost.

The printed circuit board may be comprised of a material resistant to wetting, such as mylar, if it is to be exposed to moisture or ued with the operator's bare finger. The flexible conductive member may consist of the operator's bare finger or the operator's finger encased in a glove or finger cap made of a highly conductive rubber or elastomer material. The member or members may also consist of mechanically movable playing keys with blocks of highly conductive rubber or elastomer material attached. Flexible members can adapt to uneven surfaces and provide satisfactory operation without tight mechanical tolerances.

A flexible conductive member pressed against an area will be unlikely to make contact with all of the exposed conductors at precisely the same time. Some contacts are likely to be intermittent while the member is being imposed on the area. The operator may use more than one finger or member to enter data at a maximum rate and may momentarily contact more than one area at a time. The invention provides logic systems to discriminate against the transient presentations of improper combinations resulting from such conditions while coupling presentations of proper combinations to the utilizing apparatus.

The invention provides several different conductor arrangements in which the exposed combinations have one or more characteristics in common so the logic systems can distinguish between proper and improper combinations. The characteristics include: boundary conductors common to all combinations in a set; an odd number of conductors in each combination; a predetermined number of conductors in each combination; and one and only one conductor from each of several groups in any combination. In addition to making any set of characteristics a precondition for read-in, the logic system may also require the precondition to exist without interruption for an appreciable interval.

In one type of utilizing apparatus, such as an electronic musical instrument, the response is determined by how long a control is held actuated. The logic syssem should then maintain a read in as long as the energized combination meets the established criteria. An electronic musical instrument would normally be provided with means to store the last input from the keyboard, so it can not only sound a note as long as a control is actuated, but also sustain it and allow it to decay naturally after the control is released. Such storage will also mask the effects of short interruptions in the input resulting from transient effects.

In another type of utilizing apparatus, such as computers and most data handling devices, a single response should be made to each control actuation with no regard for the time it is held. The logic system must prevent intermittent contacts from causing the same character or function to be entered more than once unless a repeat is requested by appropriate action. It does this by requiring that all contact be broken before a read in of the same character or function can be repeated. The operator can make two successive read ins of the same character simply by jabbing the same area twice with one finger. Breaks in contact are not required if the combination presented is different from the last read in so more than one finger can be used for rapid entry of sequences of different characters or functions.

In conventional keyboards, mechanical movement of the controls against limits provides the operator with a tactile feedback which lets him know when his action is complete. As most of the keyboards of the present invention do not provide a mechanical movement response, the invention provides feedback by producing an audible sound each time a read in is made.

BRIEF DESCRIPTION OF THE DRAWINGS

FIG. 4a is a plan view of a control layout which might be used for an electronic musical instrument.

FIG. 4b shows a cross section of a keyboard control with the operator's finger in operating position.

FIG. 4c shows a cross section of a keyboard control including a side view of a playing key with flexible conductive element attached in position to be pressed against the control area.

FIG. 5 is a logic circuit diagram of a modified system using the keyboard of FIG. 1.

FIG. 6b is a chart showing the conductor combinations of the keyboard of FIG. 6a for each of the decimal digits, 0 through 9.

FIG. 7a is a logic circuit diagram of apparatus to convert the outputs of the keyboard of FIG. 6a to binary code for the decimal digits 0 through 9.

FIG. 7b is a chart showing the output code combinations produced by the apparatus of FIG. 7a.

FIG. 8 is a partial block and a partial logic circuit diagram of apparatus to be used with the keyboard of FIG. 6a.

FIG. 9 is a block and logic circuit diagram of a modified system for using the keyboard of FIG. 2.

BRIEF DESCRIPTION OF THE PREFERRED EMBODIMENTS

Figure 1:
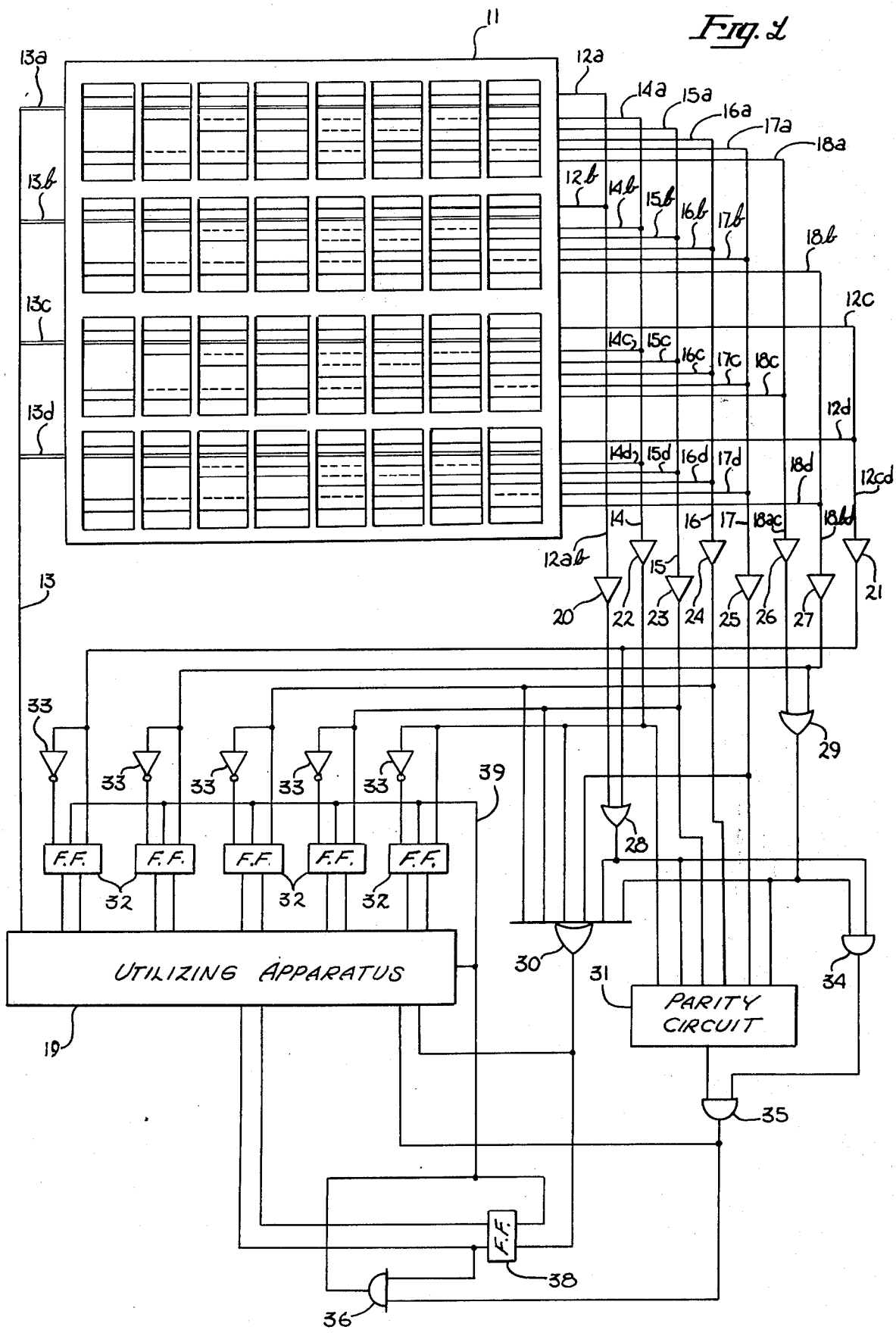
FIG. 1 is a partial plan view and partial block diagram of one embodiment of the invention.

The apparatus of FIG. 1 is suitable for the entry of one data character at a time into a computer or other data handling device using one finger. It can also be used for the staccacto type playing of one note at a time on an electronic musical instrument. Operation is restricted to staccato or one finger control by apparatus which requires an interruption of all contact between successive entries of characters or notes. Only combinations of odd numbers of conductors are used to represent each character or note and a parity circuit checks to see that this condition is met by the conductors energized before a read in is made.

All of the conductor combinations used to represent the characters or notes of a particular group further include the same pair of boundary conductors. Both conductors of the pair must be energized before a read in will be made. The other conductors of each combination are between the boundary conductors so they will be contacted by the operator's finger whenever the finger is in contact with both boundary conductors. Providing two boundary conductors on a flat printed circuit board will generally be cheaper than providing a structure in which one conductor is recessed so that the others in the area must be contacted before it can be touched.

Keyboard 11 of FIG. 1 has 32 separate areas for keying different characters or notes which are arranged in four rows of eight each. It will be recognized that the areas could be arranged in different patterns such as in a single row which would be more convenient for a musical instrument keyboard. The areas are sized so that the operator's finger can cover the exposed conductors so they will be electrically coupled together through the skin conductivity. Keyboard 11 may consist of a frame with 32 openings and a printed circuit board which presents the desired patterns of exposed conductors through each opening. The printed circuit board should be of a nonwetting type of insulating material, such as mylar, to minimize the effects of any moisture which may be on the operator's fingers.

Conductors 12, 13a, 14a, 15a, 16a, 17a, and 18a appear in order from the top down along the top row. The dotted line segments showing through the openings indicate that the conductor is not exposed through that opening. The segment may not be exposed by covering it with a coating or thin sheet of insulating material or by routing it through and along the opposite side of the printed circuit board. The successive rows from the top have the same pattern of conductors designated by the same numbers as does the top row but with subscripts b, c, and d appended for the second, third, and fourth rows respectively.

Conductors 12a through d, 13a through d, and 18a through d are exposed in all areas of their respective rows. Conductors 14a through d are exposed in alternate areas of their respective rows, conductors 15a through d are exposed in alternate adjacent pairs of areas of their respective rows, and conductrs 16a through d are exposed in the last four areas of their respective rows. Conductors 12a and 12b connect together to line 12ab and conductors 12c and 12d to line 12cd. Conductors 18a and 18c connect to line 18ac and conductors 18b and 18d to line 18bd. All other conductors with the same numbers but different subscripts connect together to the respective one of lines 13, 14, 15, 16, and 17 having the same number.

Line 13 connects to utilizing apparatus 19 which applies a keying supply voltage to it and therefore to lines 13a through d. The keying voltage supply will be current limited so that the operator cannot possibly receive a damaging shock from it. Lines 12ab, 12cd, 14, 15, 16, 17, 18ac, and 18bd connect to the inputs of amplifiers 20 through 27 respectively. Amplifiers 20 through 27 may consist of field effect transistors biased off except when their inputs are electrically coupled through the skin or glove conductance to one of the conductors 13a through d carrying the keying supply potential. The input impedance of amplifiers 20 through 27 will be high so little current will be required from the keying supply and so there will be little drop across the skin or glove conductance. If the logic and gating circuits to be driven consist of field effect transistors, then amplifiers 20 through 27 can be eliminated and connections made directly.

The outputs of amplifiers 20 and 21 to to OR gate 28 and those of amplifiers 26 and 27 to OR gate 29. The outputs of OR gates 28 and 29 go to NOR gate 30. The outputs of amplifiers 22 through 25 go to NOR gate 30 and to odd parity circuit 31. The output of NOR gate 30 will thus indicate when none of the conductors connecting to lines 12, 14, 15, 16, 17, and 18 are electrically coupled to the keying voltage on one of lines 13a through d by the operator's finger. The output of odd parity circuit 31 will indicate when an odd number of lines 14, 15, 16 and 17 are energized as will occur when all of the conductors in any of the control areas are electrically coupled to the keying supplying by the operators's finger. This result is obtained because conductors 17a through d are exposed selectively in the area along each row so that all areas have an odd number of conductors exposed.

The outputs of amplifiers 22, 23, 24, 27, and 21 connect to the inputs of associated flip flops 32 and inverters 33. Each inverter 33 applies the opposite polarity signal to the other input of its associated flip flop 32 and thereby provides a push pull drive. Flip flops 32 only change states to reflect the inputs received from amplifiers 22, 23, 24, 27, and 21 when an enabling signal is received on line 39 as will later be explained. It will be recognized that flip flops 32 and inverters 33 could be replaced with a simple set of gates if utilizing apparatus included, or did not need, storage of input information. It is also possible to provide different types of storage arrangements.

AND gate 34 receives inputs from OR gates 28 and 29 so its output indicates when one of conductors 12a through d and one of conductors 18a through d are electrically coupled to the keying supply. If only one finger is being used, it must be across all conductors in the selected area in order to be contacting the one of conductors 12a through d and the one of conductors 18a through d which are along the upper and lower edges respectively. AND gate 35 receives inputs from odd parity circuit 31 and from AND gate 34 with the result that its output indicates when the extreme conductors are electrically coupled and the number of conductors coupled is odd.

The output of AND gate 35 goes to AND gate 36 and to utilizing apparatus 19. The output of NOR gate 30 goes to the set input of flip flop 38 and to utilizing apparatus 19. When no conductor is electrically coupled to the keying supply, the output of NOR gate 30 sets flip flop 38. When flip flop 38 is set, it enables AND gate 36 so that the next output of AND gate 35 will pass to line 39 and enable flip flops 32 to respond to the inputs received from amplifiers 22, 23, 24, 27 and 21. Line 39 also goes to the reset input of flip flop 38 so the output will also reset flip flop 38 to disable AND gate 36. This removes the enabling voltage from line 39 and flip flops 32 then remain in the conditions obtained while line 39 had an enabling voltage.

After the outputs of amplifiers 22, 23, 24, 27, and 21 are read into flip flops 32 by the momentary enabling voltage on line 39, it is necessary that the operator lift his finger so no conductors will be electrically coupled to the keying supply before another read in can be made. The output of NOR gate 30 then sets flip flop 38 so a new cycle can be initiated when the exposed conductors of an area are again electrically coupled to the keying supply. If a continuous read in were desired whenever a proper combination was electrically coupled, NOR gate 30, AND gate 36, and flip flop 38 could be eliminated and the output of AND gate 35 applied directly to line 39. It will be recognized that it would also be possible to eliminate odd parity circuit 31 and AND gate 35 by using the output of AND gate 34 to enable line 39.

The outputs from NOR gate 30, AND gates 35 and 36, and flip flop 38 to utilizing apparatus 19 may be useful in a number of ways depending on the nature of utilizing apparatus 19. Some of them may also be unnecessary. If utilizing apparatus 19 is a musical instrument, for example, the signal from NOR gate 30 when the operator's finger is lifted would initiate the decay of the output audio signal. A musical instrument would automatically provide an audible indication when a read in took place by producing a musical note corresponding to the area contacted. Other types of utilizing apparatus 19 might have modifications made to include an audible indicator or other type of indicator to let the operator know when a read in has occurred and the data he intended has been entered.

Figures 2, 3:
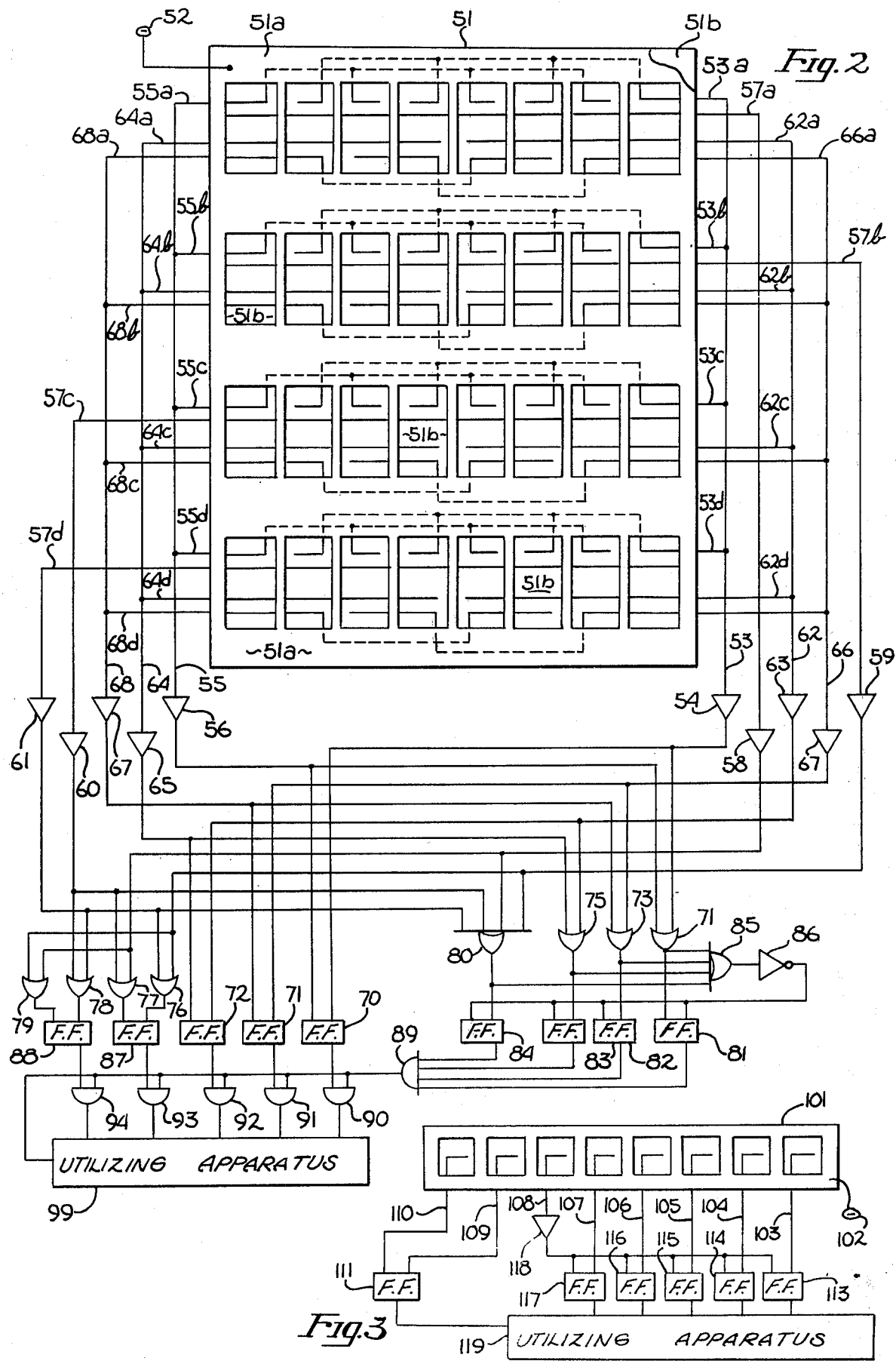
FIG. 2 is a partial plan and partial block diagram of another embodiment of the invention.
FIG. 3 is a partial plan view and partial block diagram of a simplified arrangement of touch response controls for auxiliary functions.

The apparatus of FIG. 2 is also suitable for one finger operation to enter data characters or to play musical notes in staccato fashion. The finger must be lifted between entries so that no conductor is electrically coupled for a short interval. Each control area has the same number of conductors exposed with the number including one from each of a plurality of groups. Storage means are provided so the conductors in an area do not all have to be touched at the same time but can be touched in turn. All must have been touched before each read in. This system allows large numbers of conductors to be used in each control area and the character entered by having the operator's finger wiped across the area.

Keyboard 51 of FIG. 2, like keyboard 11 of FIG. 1, has 32 areas for characters or notes arranged in four rows of eight each and it will be recognized that the areas could also be arranged in other configurations such as a single row. Upper board 51a of keyboard 51 is the same as the frame of keyboard 11 except that a conductor is plated on its upper surface and the openings are smaller. The operator's finger must touch this conductor when it extends through the openings. Lower board 51b is the same as the printed circuit board of keyboard 11 except that the conductor patterns are different. A currant limited keying supply 52 is connected to the conductor plated on upper board 51a. It will be recognized that this same arrangement could be used with keyboard 11 to replace conductors 13a through d on the printed circuit board.

Each row of keyboard 51 has the same pattern of conductors with the same number designations but with different letter subscripts for the different rows. Conductors 53a through d connect together to line 53 going to amplifier 54, conductors 55a through d to line 55 to amplifier 56, conductors 62a through d to line 62 to amplifier 63, and conductors 64a through d to line 64 to amplifier 65. Conductors 57a through d connect to amplifiers 58 through 61 respectively. Conductors 66a through d connect together to line 66 going to amplifier 67 and conductors 68a through d to line 68 to amplifier 69. The conductors are arranged to require the minimum number of crossovers if lower board 51b has conductors on one side only. Upper board 51a covers the non-exposed areas.

Conductors 53a through d are exposed through one set of alternate areas and conductors 55a through d through the other set of alternate areas. Conductors 62a through d are exposed in the areas on the right half of keyboard 51 and conductors 64a through d on the left half. Conductors 66a through d are exposed in a set of alternate pairs of areas and conductors 68a through d in the other set of alternate pairs. Conductors 53a through d, conductors 62a through d, and conductors 66a through d are thus exposed in the same patterns on keyboard 51 as conductors 14a through d, conductors 16a through d, and conductors 15a through d respectively on keyboard 11. Each row has the same exposed pattern of these conductors.

Each control area will thus include one of conductors 53a through d or one of conductors 55a through d, one of conductors 62a through d or one of conductors 64a through d, and one of conductors 66a through d or one of conductors 68a through d. Conductors 57a through d are exposed in the areas of the top through bottom rows respectively so each control area will also include one of conductors 57a through d.

Amplifiers 54, 56, 58, 59, 60, 61, 63, 65, 67, and 69 may be the same as amplifiers 20 through 27 of FIG. 1 and, like them, may be replaced with direct connections if the following circuits have high impedance inputs. The outputs of amplifiers 54 and 56 go to flip flop 70 and OR gate 71 so the state of flip flop 70 will depend on whether line 53 or 55 is energized and OR gate 71 will have an output if either is energized. The outputs of amplifiers 63 and 65 go to flip flop 72 and OR gate 73 and those of amplifiers 67 and 69 to flip flop 74 and OR gate 75. The states of flip flops 72 and 74 thus depend on which of lines 62 and 64 and which of lines 66 and 68 respectively are energized. OR gates 73 and 75 will have outputs if line 62 or 64 and line 66 or 68 respectively are energized.

The outputs of amplifiers 58 through 61 all go to OR gate 80 and each output goes to two of OR gates 76 through 79. If any of conductors 57a through d is energized, OR gate 80 will produce an output and two of OR gates 76 through 79 will produce outputs.

Conductor 57a drives OR gates 77 and 79, conductor 57b OR gates 76 and 79, conductor 57c OR gates 77 and 78, and conductor 57d OR gates 76 and 78. Flip flops 87 and 88 receive inputs from OR gates 76 and 77 and OR gates 78 and 79 respectively so their states depend on which of conductors 57a through d was last energized.

The outputs of OR gates 71, 73, 75, and 80 all go to OR gate 85 and individually to the set inputs of flip flops 81 through 84 respectively. If the operator's finger is lifted so that no conductors of keyboard 51 are electrically coupled to keying supply 52, none of OR gates 71, 73, 75, 80 and 85 will be producing outputs. Inverter 86, which is driven by the output of OR gate 85, will then be producing an output to the reset inputs of flip flops 81 through 84. When all of the conductors in any control area of keyboard 51 are electrically coupled to keying supply 52 by the operator's finger, OR gates 71, 73, 75, 80, and 85 will each be producing an output.

Flip flops 81 through 84 will then be in the set condition and flip flops 70, 72, 74, 87, and 88 will be in the condition or state determined by which conductors are exposed in the particular control area. All conductors need not have been coupled to keying supply at the same time so long as at least one is always coupled to avoid a rest drive from inverter 86. The same result can thus be produced by having the operator's finger contact all of the conductors in the area at the same time or by having the finger wiped across the conductors in turn. This latter action may cause the finger to break contact with the conductor on upper board 51a and so with keying supply 52. Another finger or the other hand should then be maintained in contact with the conductor connected to keying supply 52 to ensure that the conductors contacted with the moving finger will be properly energized.

With all of flip flops 81 through 84 set, AND gate 89 will produce an output to enable AND gates 90 through 94 and to utilizing apparatus 99. The enabled AND gates 90 through 94 pass on the states of flip flops 70, 72, 74, 87 and 88 to utilizing apparatus 99 and so read in the code for the character corresponding to the control area contacted. When the operator's finger is lifted from the area, inverter 86 will produce an output to reset flip flops 81 through 84 and so disable AND gates 89 through 94. Utilizing apparatus 99 may respond to the output of AND gate 89 by producing an audible or other indication that a read in is occurring.

Keyboard 101 of FIG. 3 consists of a single row of eight areas each exposing a single conductor. The upper surface of the member in which openings to the area are formed is comprised of a conductive material which is connected to keying supply 102. Exposed conductors 103 through 107 connect to the set inputs of flip flops 113 through 117. Exposed conductor 108 connects to amplifier 118 which has its output connected to the reset inputs of flip flops 113 through 117. The operator can thus individually set any of flip flops 113 through 117 by contacting the associated one of conductors 103 through 107 and can reset all by contacting conductor 108.

Exposed conductors 109 and 110 go to the set and reset inputs of flip flop 111 so it can be controlled independently of the others. The outputs of flip flops 111 and 113 through 117 go to utilizing apparatus 119 where they may be used to control various functions. If utilizing apparatus 119 is a musical instrument, for example, the apparatus of FIG. 3 can be used for the Voicing Stops and similar controls while apparatus such as that of FIGS. 1 and 2 is used as solo melody playing controls. While keyboards like those of FIGS. 1 and 2 can only produce codes representing one note at a time, they may be used with instruments having means, such as is shown in my U.S. Pat. No. 3,711,618, which will produce chords and bass in response to single note input sequences. More than solo melody playing can thus be achieved.

FIG. 4a shows an upper board 201 for a keyboard in which the openings to the control areas are in a single row. It has previously been mentioned that such an arrangement is more convenient for playing on an electronic musical instrument and that the keyboards of FIGS. 1 and 2 could be arranged in this way. FIG. 4b shows a cross section taken through one of the openings of upper board 201 and through a lower board 202 to which a set of conductors 204 are attached. An operators's finger 203 is shown extending through the opening in upper board 201 to electrically couple conductors 204 together.

FIG. 4c shows the same cross section of upper board 201, lower board 202 and conductors 204 along with a playing key structure in place of the operator's finger 203 of FIG. 4b. Flexible conductive element 211 is cemented or otherwise attached to playing key 212 and may consist of a block of an elastic conductive material such as the highly conductive elastomer material disclosed in U.S. Pat. No. 3,721,778 to seeger, Jr. et al. Spring member 213 resiliently supports playing key 212 with respect to supporting member 214 on which lower board 202 is also mounted. Restraining member 215 limits the upward deflection of playing key 212 in response to the force exerted by spring member 213.

When the operator or player pushes playing key 212 down with his finger, element 211 is pressed against conductors 204 and electrically couples them together. The result is thus the same as if he had contacted conductors 204 with his finger as in FIG. 4b. The mechanical movement of playing key 212 against a spring force, however, gives him the feel of a conventional keyboard. It will be recognized that electronic organ playing keys may be similar to this arrangement except that electrical switches are operated instead of a flexible conductive element 211 being pressed against conductors 204.

A keyboard arranged with an upper board 201 as shown in FIG. 4a can be operated by placing a finger 203 through the selected opening to electrically couple conductors 204 together. A structure such as shown in FIG. 4c can also be added to the same arrangement with a flexible conductive element 211 attached to a playing key 212 over each opening. Operation is then obtained by depressing the selected one of the playing keys 212. A choice of finger or playing key operation can be made by adding playing keys 212 and conductive elements 211 along with members 213 and 215 for the latter.

The apparatus of FIG. 5 allows any two control areas to be contacted at the same time without producing a erroneous read in and does not require that all contact be broken between read in of successive characters. This allows data characters to be entered more rapidly as one finger can start to contact one area whike another finger is being removed from another area. It will also allow a musical instrument using the apparatus to played legato style in which successive notes are sounded without a break in between. The inputs used are lines 14, 15, 16, and 17 and conductors 18a through d of keyboard 11 of FIG. 1 which may be rearranged with all control areas in a single row as in FIG. 4a. Conductors 12a through d are not used with FIG. 5 apparatus.

Lines 14, 15, and 16 go the inputs of AND gates 234, 235, and 236 respectively and to parity circuit 31. Parity circuit 31 also receives an input from line 17 and, as in the apparatus of FIG. 1, produces an output which indicates when odd parity conditions are met by an odd number of lines 14, 15, 16, and 17 being energized. It will be recalled that electrical coupling of all conductors in any control area will energize an odd number of lines 15, 16, 14, and 17 from keyboard 11. An inspection will show that electrical coupling of all conductors in two control areas will either not energize more of lines 14, 15, 16, and 17 than one of them would alone or will energize an even number.

The detailed arrangement for parity circuit 31 shown here could also be used in the apparatus of FIG. 1. OR gate 241 and AND gate 242 receive inputs from lines 14 and 15. OR gate 243 and AND gate 244 similarly receive inputs from lines 16 and 17. AND gate 245 receives the output of OR gate directly and the output of AND gate on an inverting input. AND gate 246 similary receives the output of OR gate 243 directly and the output of AND gate 244 on an inverting input.

AND gate 245 will have a "1" output if one but not both of lines 14 and 15 is energized. AND gate 246 will similarly have a "1" output if one but not both of lines 16 or 17 is energized. OR gates 247 and AND gate 248 receive inputs from AND gates 245 and 246 and furnish outputs to the direct and inverting inputs respectively of AND gate 249. The output of AND gate 249 will thus be a "1" if one or if three of lines 14, 15, 16, and 17 are energized. A "1" output from AND gate 249 thus indicates that odd parity conditions have been met.

Conductors 18a through d go the inputs of one and only one detector 250. It will be recognized that one of conductors 18a through d will be energized if all of the conductors in any control area are electrically coupled to a keying supply and that more than one will be energized only if contact is being made with more than one control area. One and only one detector 250 may consist of OR gates 251, 253, 257, 255, and 258 and AND gates 252, 254, 256, and 259 as shown.

OR gates 251 and 253 receive inputs from conductors 18a and 18b and from conductors 18c and 18d respectively and apply their outputs to OR gate 257 and AND gate 256. OR gate 257 will thus have a "1" output if any of conductors 18a through d is energized. AND gates 252 and 254 receive inputs from conductors 18a and 18b and from conductors 18c and 18d. OR gate 258 receives the outputs of AND gates 252, 254, and 256 as inputs and will thus have a "1" output if more than one of conductors 18a through d are energized. AND gate 259 receives the output of OR gate 257 directly and the output of OR gate 258 on an inverting input and therefore produces a "1" output when one and only one of conductors 18a through d is energized.

AND gate 237 receives an input from OR gate 255 which has inputs from conductors 18b and 18d. AND gate 238 receives an input from OR gate 253 which is driven by conductors 18c and 18d. Each energized one of conductors 18a through d will thus produce a different combination of inputs to AND gates 237 and 238. When the other inputs of AND gates 237 and 238 are enabled, their outputs will indicate which of conductors 18a through d is energized.

AND gate 260 receives inputs from AND gate 249 of parity circuit 31 and from AND gate 259 of one and only one detector 250. When odd parity conditions are met and one and only one of conductors 18a through d is energized, AND gate 260 will produce an output to enable AND gates 234 through 238 to pass their other inputs to utilizing apparatus 261. OR gate 262 receives inputs from OR gates 241, 243, and 257 so it will have a "1" output to utilizing apparatus 261 whenever any of conductors 18a through d or lines 14, 15, 16, and 17 are energized.

If utilizing apparatus 261 is an electronic musical instrument, the change in sound from one note to the next will indicate when a read in is made. If utilizing apparatus 261 is not a musical instrument, AND gate 263 and sound transducer 264 may be added to provide an audible indication of when a read in is being made. AND gate 263 is enabled by the output of AND gate 260 when it is enabling AND gates 234 through 238 for a read in. AND gate 263 then passes its other input from utilizing apparatus 261 to drive sound transducer 264. This other input will be an audible frequency signal so sound transducer 264 will then produce an audible tone.

If utilizing apparatus 261 does not generate an audible frequency signal as part of its normal operation, an oscillator or other means of generating such a signal will have to be added. Utilizing apparatus 261 might also include means to limit the audible frequency signal to short intervals following the initiation of each enabling output from AND gate 260 so minimum power will be used for the audible indications.

Figure 6A:
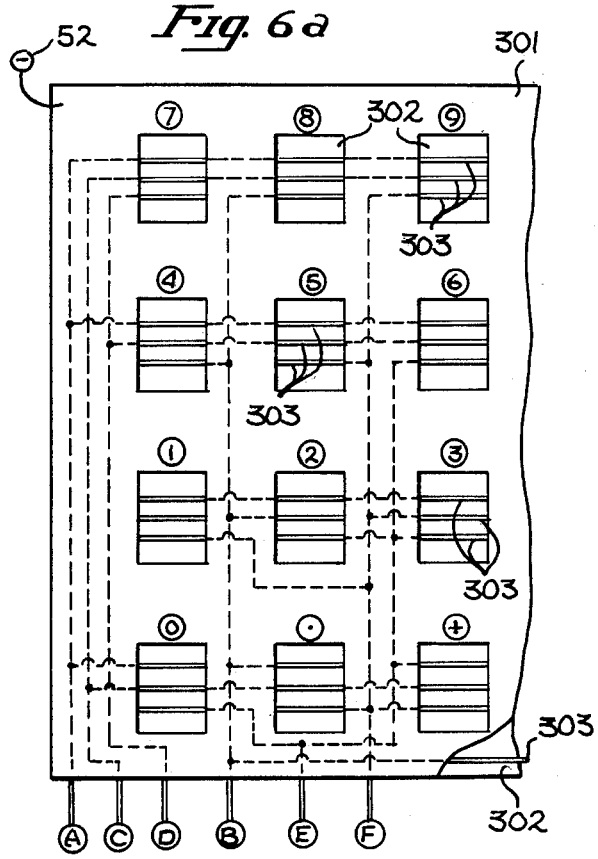
FIG. 6a is a plan view of another keyboard arrangement in accordance with the invention which uses three of six conductors for each control combination.

FIG. 6a shows a fragmentary portion of another keyboard apparatus which can be used with equipments such as small hand held calculators. Upper board 301 has openings which expose areas of lower board 302 on which three conductors 303 are printed. A conductive material on the upper surface of upper board 301 is connected to the keying supply 52. The openings in upper board 301 need only be large enough to allow the operator's finger to contact the three conductors so they can be small and closely spaced. The conductors 303 connect to six different lines designated A, B, C, D, E, and F.

Figures 6B, 7A, 7B:
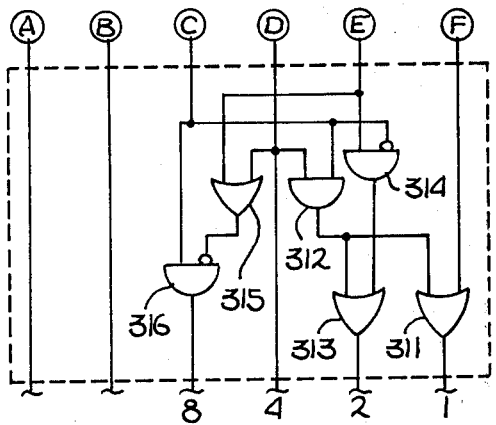

The six lines A, B, C, D, E, and F can be taken in twenty different combinations of three. Twelve of the twenty possible combinations are used on the fragment shown including a special set for the debimal digits 0 through 9. The combinations for the decimal digits are shown in the table of FIG. 6b with "1" indicating the lines to which conductors 303 in the combination are connected. It will be noted that a conductor 303 in each of the combinations for decimal digits 0 through 9 are attached to line A. Line A cannot be involved in other combinations of three because the possible combinations including it are exhausted.

When line A is energized, it signifies that the combination present represents a decimal digit. It is very desirable that the decimal digits be represented by the binary codes used in present computing equipments. The combinations shown in FIG. 6b were chosen so a minimum amount of translation would be necessary. It will be noted that lines F, E, D, and C correspond to the binary code digits for 1, 2, 4, and 8 respectively for all decimal digits except 0 and 7. The apparatus of FIG. 7a converts the inputs on lines F, E, D, and C to the proper outputs for binary digits 1, 2, 4, and 8 respectively as shown in the table of FIG. 7b.

In the apparatus of FIG. 7a, OR gate 311 produces the output for the binary digit 1, OR gate 313 produces the output for the binary digit 2, and AND gate 316 produces the output for the binary digit 8. The output for the binary digit 4 is taken directly from line D. OR gate 311 receives an input from line F so its output will be a "1" whenever line F is energized. OR gate 311 also receives an input from AND gate 312 which is driven by lines D and C. Lines D and C are both energized only for the combination of decimal digit 7 so AND gate 312 and OR gate 311 have "1" outputs for 7. The output of OR gate 311 thus conforms to binary digit 1 for all decimal digit combinations.

OR gate 313 receives inputs from AND gates 312 and 314. Line E is applied directly to AND gate 314 and line C is applied to its inverting input. AND gate 314 will thus produce a "1" output whenever line E is energized unless line C is also energized. The output of OR gate 313 will be a "1" when the output of AND gate 312 is a "1" for the decimal digit 7 and when line E is energized except for the decimal digit 0 which line C is also energized. AND gate 316 has line C applied directly and the output of OR gate 315 applied to its inverting input. OR gate 315 receives inputs from lines E and D to inhibit the output of AND gate 316 for the decimal digits 0 and 7. The outputs of OR gate 313 and AND gate 316 thus correspond to binary digits 2 and 8 respectively for each of the decimal digit combinations.

The relatively simple apparatus of FIG. 7a can thus translate the inputs on lines F, E, D, and C to outputs corresponding to the binary digits representing the decimal digits. Combinations representing other characters and functions can be set up knowing the same translations will be made on the inputs from lines F, E, and C. Lines A, B, and D are not affected by the apparatus of FIG. 7a.

Figure 8:
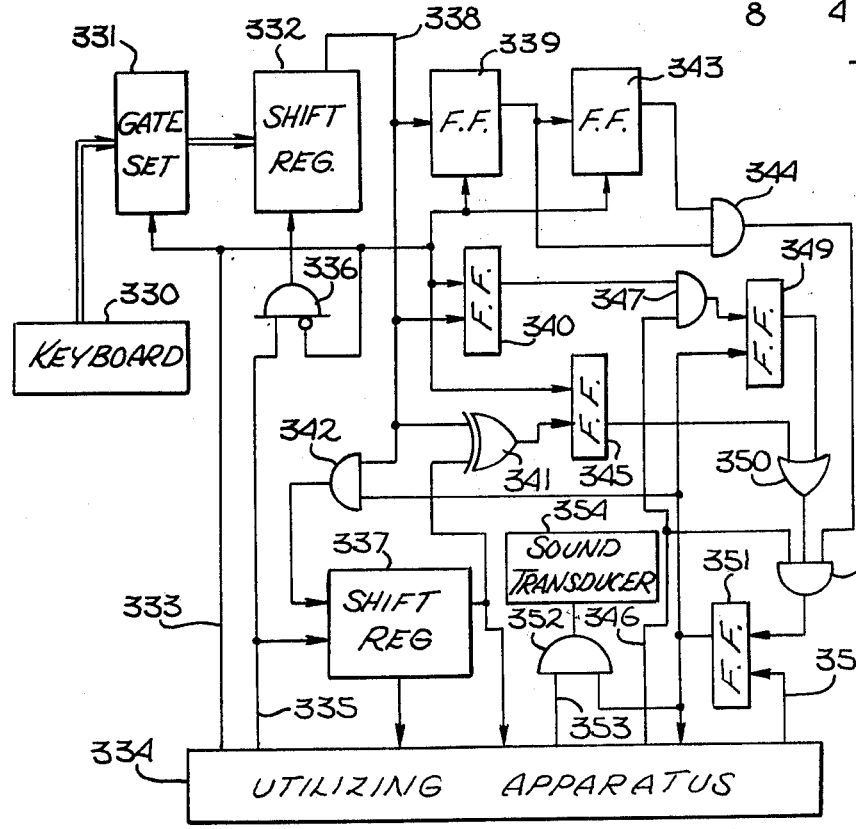

The apparatus of FIG. 8 checks that three and only three input lines are energized before reading in the combination and so assures that a proper combination is being obtained for keyboards such as that of FIG. 6a. The apparatus further requires that the combination be different than the last read in or that there has been an interval during which no inputs were energized since the last read in. This allows the operator to enter data at a maximum rate as all contact need not be broken between entries unless the same character is to be repeated.

Keyboard 330 is of a type such as that shown in FIG. 6a providing six output lines in the cable to gate set 331. The outputs of gate sets 331 are applied to the parallel inputs of shift register 332 when line 333 from utilizing apparatus 334 is energized. A series of clock pulses from utilizing apparatus 334 are supplied on line 335 to AND gate 336 and shift register 337. AND gate 336 has its inverting input connected to line 33 so the clock pulses on line 335 are passed to step shift register 332 when utilizing apparatus periodically deenergizes line 333 for a read in check.

With line 333 deenergized, shift registers 332 and 337 are stepped synchronously by the clock pulses on line 335 to produce serial read outs of the information contained. The serial output of shift register 332 on line 338 goes to the toggle input of flip flop 339, the set input of flip flop 340, to Exclusive OR gate 341 and AND gate 342. Each "1" in the output resulting from an energized line from keyboard 330 causes flip flop 339 to change position. The first or any "1" on line 338 sets flip flop 340. Exclusive OR gate 341 receives its other input from the serial output of shift register 337 and so will produce an output only if the data character represented in the output of shift register 332 is different than that represented in the output of shift register 337.

Flip flops 339, 340, 343 and 345 all have their reset inputs connected to line 33 so they will be reset at the strt of the readouts from shift registers 332 and 337. An output from flip flop 339 is connected to the toggle input of flip flop 343 so the two function as a binary counter couning the number of "1" outputs from shift register 332 on line 338. AND gate 344 receives inputs from flip flops 339 and 343 which cause it to produce a "1" output when a count of three is registered. Flip flop 340 will be set if any output on line 338 is a "1". Flip flop 345 will be set by an output from Exclusive OR gate 341 if the outputs of shift registers 332 and 337 are different.

When all bits have been read out of shift registers 332 and 337, utilizing apparatus 334 energizes line 346 to enable AND gates 347 and 348. If flip flop 340 has remained reset, AND gate 347 will then produce an output to set flip flop 349. OR gate receives inputs from flip flops 345 and 349 and produces a "1" output to AND gate 348 if either are set. If flip flops 339 and 343 are registering a count of three, AND gate 344 will also be producing a "1" output and the resulting output from AND gate 348 will set flip flop 351. When set, the output from flip flop 351 resets flip flop 349, enables AND gate 342 and AND gate 352, and triggers utilizing apparatus 334 to produce another series of clock pulses while keeping line 333 deenergized.

Shift registers 332 and 337 are then stepped through their cycles again. With AND gates 242 enabled, the output of shift register 332 on line 338 is read into shift register 337. At the end of this second cycle, shift register 337 holds the new combination. The enabled AND gate 352 receives an audible tone signal on line 353 from utilizing apparatus 334 and applies it to drive sound transducer 354 to produce an audible signal while flip flop 351 is set. When the second cycle of shift registers 332 and 337 is completed, utilizing apparatus produces an output on line 355 to reset flip flop 355.

If keyboard 330 has six output lines as does the keyboard shown in FIG. 6a, then gate set 331 will have to include six gates and shift registers 332 and 337 will have to be able to hold six bits. Keyboard 330 might, however, have a greater or lesser number of output lines and it would only be necessary to change the capacities of gate set 331 and shift registers 332 and 337. It will be recognized that the arrangement of flip flops 339 and 343 with AND gate 344 could also be changed to produce an output on a different count or that other combination characteristics could be checked from the serial output of shift register 332. The state of flip flop 339, for example, will indicate odd or even parity for the energized inputs.

The apparatus of FIG. 9 shows a modification to the apparatus of FIG. 5 to adapt it for use with the keyboard of FIG. 2. One and only one detector 250 receives inputs from conductors 57a through d instead of from conductors 18a through d. Exclusive OR gates 401, 402, and 403 together with AND gate 404 substituted for parity circuit 31. Pairs of lines 53 and 55, 62 and 64, and 66 and 68 provide inputs for Exclusive OR gates 401, 402, and 403 respectively. AND gate 404 receives inputs from each of Exclusive OR gates 401, 402, and 403 and produces a "1" output to AND gate 260 for read in when one and only one of each of the pairs of lines 53, and 55, 62 and 64, and 66 and 68 are energized. Lines 68, 64, and 55 also connect to lines 231, 232, and 233 respectively for input to AND gates 234, 235, and 236 respectively.

Conductors 57a through d are each associated with one of the rows of keyboard 51 of FIG. 2 just as conductors 18a through d are in keyboard 11 of FIG. 1. Operation of one and only one detector 250 and its outputs to AND gates 237, 238, and 260 are the same as in FIG. 5. Lines 68, 64, and 55 are energized to provide binary combinations representing the individual areas in each row of keyboard 51 as do lines 14, 15, and 16 of keyboard 11. The output of AND gate 260 thus enables the read in of information when one and only one of conductors 57a through 57d and one and on one of each pair of conductors 53 and 55, 62 and 64, and 66 and 68 are energized.

What I claim is:
1. In a keyboard apparatus for input of information to a utilizing apparatus, the combination of:
    a. a set of conductors arranged in different combinations in each of a plurality of areas;
    b. means responsive to an operator for energizing those of said conductors in the combination located in any selected one of said areas;
    c. a particular conductor exposed in each of said areas in a location in which said particular conductor will be the last contacted by said energizing means;
    d. means connected to said particular conductor for determining when said particular conductor is energized; and
    e. means operated by said determining means for coupling said conductors to said utilizing apparatus.
2. The combination according to claim 1 including a second particular conductor exposed only along a border of each of said areas and connected to said determining means; and wherein said determining means operates said coupling means when said particular conductor and said second particular conductor are energized.

* * * * *